United States Patent
Lim et al.

(10) Patent No.: US 8,012,823 B2
(45) Date of Patent: Sep. 6, 2011

(54) METHODS OF FABRICATING STACK TYPE CAPACITORS OF SEMICONDUCTOR DEVICES

(75) Inventors: Han-jin Lim, Seoul (KR); Jae-young Park, Yongin-si (KR); Young-jin Kim, Yongin-si (KR); Seok-woo Nam, Seongnam-si (KR); Bong-hyun Kim, Incheon (KR); Kyoung-ryul Yoon, Goyang-si (KR); Jae-hyoung Choi, Hwaseong-si (KR); Beom-jong Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 12/453,582

(22) Filed: May 15, 2009

(65) Prior Publication Data

US 2010/0009508 A1  Jan. 14, 2010

(30) Foreign Application Priority Data

Jul. 10, 2008  (KR) ........................ 10-2008-0067220

(51) Int. Cl.
 *H01L 21/8242* (2006.01)
 *H01L 21/20* (2006.01)

(52) U.S. Cl. ........ 438/239; 438/253; 438/250; 438/381; 438/396

(58) Field of Classification Search .............. 438/3, 240, 438/239, 171, 190, 210, 238, 241, 243, 244, 438/250, 253, 329, 387, 381, 386, 393, 396, 438/397, 398

See application file for complete search history.

(56) References Cited

U.S. PATENT DOCUMENTS

| 2004/0018307 A1* | 1/2004 | Park et al. ................. 427/255.36 |
| 2007/0077759 A1* | 4/2007 | Nakanishi ..................... 438/678 |
| 2008/0048291 A1* | 2/2008 | Chung et al. .................. 257/532 |

FOREIGN PATENT DOCUMENTS

| JP | 9-69615 | 3/1997 |
| KR | 10-2004-59971 | 7/2004 |
| KR | 10-2005-57952 | 6/2005 |

* cited by examiner

*Primary Examiner* — Chuong A. Luu

(74) *Attorney, Agent, or Firm* — Harness, Dickey & Pierce, PLC

(57) ABSTRACT

Provided are methods of fabricating capacitors of semiconductor devices, the methods including: forming a lower electrode on a semiconductor substrate, performing a pre-process operation on the lower electrode for suppressing deterioration of the lower electrode during a process, forming a dielectric layer on the lower electrode using a source gas and an ozone gas, and forming an upper electrode on the dielectric layer, wherein the pre-process operation and the forming of the dielectric layer may be performed in one device capable of atomic layer deposition.

19 Claims, 12 Drawing Sheets

METHODS OF FABRICATING STACK TYPE CAPACITORS OF SEMICONDUCTOR DEVICES

PRIORITY STATEMENT

This application claims priority under 35 U.S.C. §119 to Korean Patent Application No. 10-2008-0067220, filed on Jul. 10, 2008, in the Korean Intellectual Property Office (KIPO), the entire contents of which are incorporated herein by reference.

BACKGROUND

1. Field

Example embodiments relate to methods of fabricating semiconductor devices, and more particularly, to methods of fabricating stack type capacitors of semiconductor devices.

2. Description of the Related Art

As semiconductor devices, for example dynamic random access memories (DRAM), achieve higher integration densities, the horizontal area of memory cells within the devices may decrease. As the horizontal area of memory cells decrease, the horizontal area for forming a stack type capacitor included in the memory cell, in which a lower electrode, a dielectric layer, and an upper electrode are stacked, may also decrease.

As the horizontal area for forming a stack type capacitor decreases, cell capacitance may also decrease. When the cell capacitance decreases, the sense margin of a memory cell during reading or writing may decrease and the semiconductor device may not operate satisfactorily at low voltage. Accordingly, various techniques for increasing cell capacitance while decreasing horizontal cell area are being studied.

In order to increase cell capacitance, the thickness of a dielectric layer may be reduced, the surface area of a capacitor may be increased, and/or a dielectric layer having a high dielectric constant may be used. In order to increase the surface area of a capacitor, a cylinder type capacitor including a lower electrode having a 3D shape may be used. However, it may be difficult to deposit a uniform, high quality, high dielectric constant (hereinafter "high k") dielectric layer with acceptable step coverage on a high aspect ratio feature. For example, it may be difficult to form a reliable high k dielectric layer on the surface of a cylinder type lower electrode. As the integration density of semiconductor devices increases, the thickness of the high k dielectric layer may be reduced and it may become increasingly difficult to form a reliable high k dielectric layer on a cylinder type lower electrode.

SUMMARY

Example embodiments provide methods of fabricating capacitors of semiconductor devices, including methods of forming capacitors having reduced thickness high k dielectric layers on lower electrodes that are reliable and of improved layer quality.

According to example embodiments, there is provided a method of fabricating a capacitor of a semiconductor device. The method includes forming a lower electrode on a semiconductor substrate, performing a pre-process operation for suppressing deterioration of the lower electrode during a process, on the lower electrode, and then forming a dielectric layer on the lower electrode on which the pre-process operation is performed, and forming an upper electrode on the dielectric layer. The performing of the pre-process operation and the forming of the dielectric layer are performed in one device for performing a method of atomic layer deposition, and the dielectric layer is formed using a source gas and an ozone gas.

The pre-process operation may be performed by injecting the ozone gas into a chamber including the semiconductor substrate on which the lower electrode is formed. In the pre-process operation, a plasma nitridization process may be performed on the surface of the lower electrode. The pre-process operation may be performed by sequentially injecting the source gas and an oxidizer having a lower oxidizing potential than the ozone gas into a chamber including the semiconductor substrate on which the lower electrode is formed.

The oxidizer having a lower oxidizing potential than the ozone gas may be comprised of an oxygen gas, steam, a nitric oxide gas, or an ozone gas mixed with a hydrogen gas, steam, a nitrogen gas, or an ammonia gas. In the pre-process operation, sequential injection of the source gas and the oxidizer may constitute one cycle and the cycle may be performed a plurality of times. The source gas may include a metal precursor and the dielectric layer may include a lanthanide metal oxide layer, a hafnium oxide layer, an aluminum oxide layer, a zirconium oxide layer, a tantalum oxide layer, a titanium oxide layer, or a perovskite oxide layer. The lower electrode may be a cylinder type, a concave type, or a pillar type lower electrode. The lower electrode may be comprised of polysilicon doped with an impurity, carbon (C), metal, or a refractory metal.

According to example embodiments, a method of fabricating a capacitor of a semiconductor device includes forming a lower electrode on a semiconductor substrate, forming a dielectric layer on the lower electrode, and forming an upper electrode on the dielectric layer. The forming of the dielectric layer is performed in one device using a method of atomic layer deposition and may include sequentially injecting a first source gas and a first oxidizer into a chamber including the semiconductor substrate on which the lower electrode is formed, and then sequentially injecting a second source gas and a second oxidizer into the chamber, wherein the first oxidizer has lower oxidizing potential than the second oxidizer.

The method may include plasma nitridization of the lower electrode before the forming of the dielectric layer. The method may be performed by injecting an ozone gas into the chamber before forming the dielectric layer. The first oxidizer may be comprised of an oxygen gas, steam, a nitric oxide gas, or an ozone gas mixed with a hydrogen gas, steam, a nitrogen gas, or an ammonia gas. The first and second source gases may be comprised of metal precursors and the dielectric layer may include a lanthanide metal oxide layer, a hafnium oxide layer, an aluminum oxide layer, a zirconium oxide layer, a tantalum oxide layer, a titanium oxide layer, or a perovskite oxide layer.

According to example embodiments, there is provided a method of fabricating a capacitor of a semiconductor device. The method includes forming a lower electrode on a semiconductor substrate, forming a dielectric layer including a high k dielectric oxide layer on the lower electrode, and forming an upper electrode on the dielectric layer. The forming of the dielectric layer is performed in one device using a method of atomic layer deposition, and may include sequentially injecting a first source gas including a metal precursor and a first oxidizer into a chamber including the semiconductor substrate on which the lower electrode is formed and then sequentially injecting a second source gas including the metal precursor and a second oxidizer to the chamber, wherein the first oxidizer has lower oxidizing potential than the second oxidizer.

The method may include injecting an ozone gas into the chamber before the forming of the dielectric layer. The metal precursor included in the first and second source gases may be comprised of an alkyl, amine, β-diketone, cyclopentadienyl (Cp), or chlorine (Cl) based ligand, the first oxidizer may include an oxygen gas, steam, a nitric oxide gas, or an ozone gas mixed with a hydrogen gas, steam, a nitrogen gas, or an ammonia gas, and the second oxidizer comprises an ozone gas.

BRIEF DESCRIPTION OF THE DRAWINGS

Example embodiments will be more clearly understood from the following brief description taken in conjunction with the accompanying drawings. FIGS. 1-22 represent non-limiting, example embodiments as described herein.

FIG. 2 is a flowchart of a method of fabricating a capacitor of a semiconductor device according to example embodiments;

FIG. 3 is a diagram illustrating an injection order of gases according to operation 70 of FIG. 2;

FIG. 4 is a flowchart of a method of fabricating a capacitor of a semiconductor device according to example embodiments;

FIGS. 5 and 6 are diagrams illustrating injection orders of gases according to operation 70 of FIG. 4;

FIG. 7 is a flowchart of a method of fabricating a capacitor of a semiconductor device according to example embodiments;

FIG. 8 is a cross-sectional view illustrating a capacitor of a semiconductor device formed according to example embodiments;

FIGS. 9-11 are cross-sectional views illustrating a method of fabricating a capacitor of a semiconductor device according to example embodiments;

FIGS. 12-16 are diagrams for describing a method of forming a dielectric layer using a method of atomic layer deposition according to example embodiments.

FIG. 17 is a comparative graph showing improved crystallinity of dielectric layers according to example embodiments;

FIG. 18 is a graph showing leakage current as a function of applied voltage for capacitors of semiconductor devices according to example embodiments;

FIG. 19 is a graph showing leakage current as a function of applied voltage for capacitors of semiconductor devices according to the conventional art, to be compared with the graph of FIG. 18;

FIG. 20 is a comparative graph showing characteristics of lower electrodes of capacitors fabricated using a method according to example embodiments and using a method according to the conventional art.

FIG. 21 is a graph showing leakage current as a function of applied voltage for capacitors of semiconductor devices according to example embodiments; and FIG. 22 is a graph showing leakage current as a function of applied voltage for capacitors of semiconductor devices according to the conventional art, to be compared with the graph of FIG. 21.

Figure 1A:
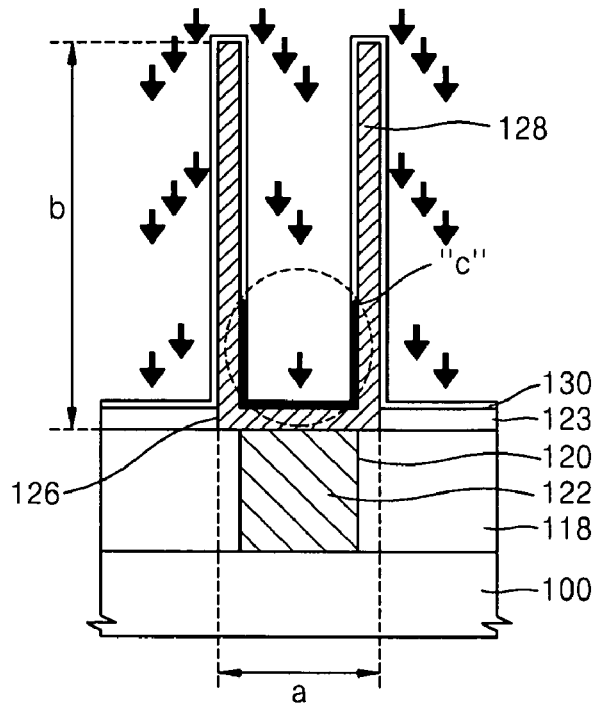
FIGS. 1A and 1B are cross-sectional views of conventional methods of forming a dielectric layer of a cylinder type capacitor.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments may be applied to a semiconductor device (e.g. a DRAM). A capacitor according to example embodiments may be, for example, a silicon-insulator-silicon (SIS), metal-insulator-silicon (MIS), and/or metal-insulator-metal (MIM) capacitor.

Various thin layers may be used as a capacitor dielectric layer according to example embodiments. A high k dielectric layer according to example embodiments may include an oxide (e.g., lanthanide metal oxide, hafnium oxide, aluminum oxide, zirconium oxide, tantalum oxide, and/or a titanium oxide). The high k dielectric layer may include a perovskite (e.g., $SrTiO_3$ and/or $BaSrTiO_3$). According to example embodiments, a zirconium oxide layer may be used as a dielectric layer. Zirconium oxide may be suitable as a dielectric layer material because zirconium oxide may have a high crystallization temperature and a high dielectric constant that sufficiently reduces an equivalent oxide thickness.

The dielectric layer may be formed by using a method of atomic layer deposition (e.g., ALD) according to example embodiments. A source gas used to form a high k dielectric layer may include various metal precursors including an alkyl, amine, β-diketone, cyclopentadienyl (Cp), and/or chlorine (Cl) based ligand. However, the metal precursors are not limited thereto. For example, if the dielectric layer is a hafnium oxide layer (HfO2) the source gas may be TEMAH. TEMAH denotes Tetrakis(ethylmethylamino)hafnium having a chemical formula of $Hf[N(CH_3)C_2H_5]_4$. Although the methods of atomic layer deposition according to example embodiments may increase and/or improve capacitance by forming a dielectric layer that may have good step coverage and low thickness on a feature with high aspect ratio (e.g., a cylinder type lower electrode), other thin layer films may be formed by using the methods of atomic layer deposition. Deposition methods according to example embodiments may be used to form any thin, high step coverage layer and are not limited to dielectrics.

A lower electrode of a capacitor according to example embodiments may be a conductor, for example, poly-silicon doped with an impurity, carbon (C), aluminum (Al), copper (Cu), and/or a refractory metal (e.g., TiN, TaN, TiSiN, TiAlN, and/or WN). An upper electrode used in example embodiments may be a conductor, for example, poly-silicon doped with an impurity, carbon (C), aluminum (Al), copper (Cu), a refractory metal (e.g., TiN, TaN, TiSiN, TiAlN, and/or WN), and/or a noble metal (e.g., Pt, Ru, or Ir).

Hereinafter, a capacitor according to example embodiments may be described as a cylinder type capacitor, but is not limited thereto. For example, a capacitor according to example embodiments may be a concave type capacitor or a pillar type capacitor. A concave capacitor may be formed in a contact hole in which a lower electrode is disposed on an interlayer insulation layer (or an insulation layer). In a pillar type capacitor, a dielectric layer may be formed only on an outer wall of a cylinder type lower electrode.

Figure 1B:
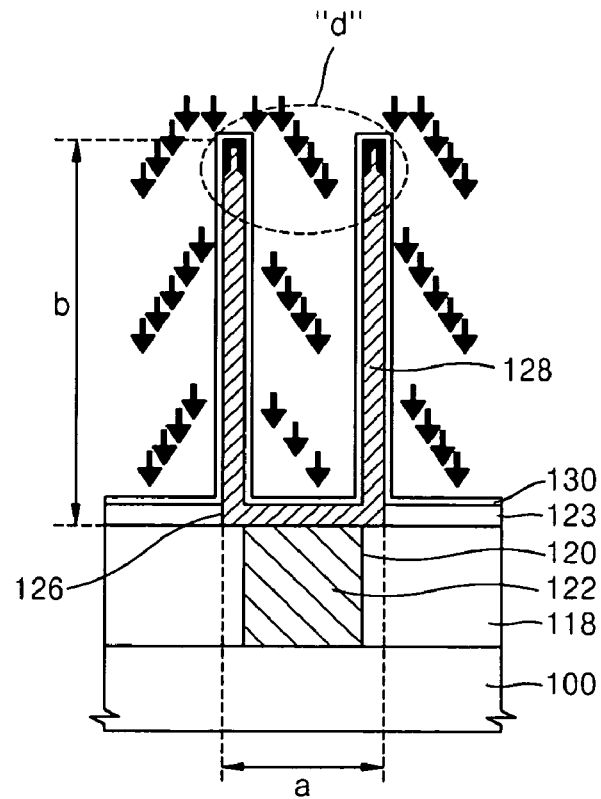

Conventional methods of forming a dielectric layer of a capacitor, for example a cylinder type capacitor, on a semiconductor substrate will now be described with reference to FIGS. 1A and 1B. FIGS. 1A and 1B are cross-sectional views of conventional methods of forming a dielectric layer 130 of a cylinder type capacitor on a semiconductor substrate 100. A contact plug 122 (e.g., a conductive layer) may be formed in a first contact hole 120 in an interlayer insulation layer 118 (e.g., a silicon dioxide layer) on the semiconductor substrate 100 (e.g., a silicon substrate). A cylinder type capacitor lower electrode (hereinafter, referred to as a cylinder type lower electrode) 128 may be formed so as to be disposed on the contact plug 122 and in a second contact hole 126 in an etch blocking layer 123 (e.g., silicon nitride). A dielectric layer 130 (e.g., a zirconium oxide layer) may be formed using a method of depositing an atomic material inside and outside the cylinder type lower electrode 128.

A ratio of height b of the cylinder type lower electrode 128 to length and/or diameter a of the second contact hole 126 in the etch blocking layer 123 (e.g., an aspect ratio) may be between 15:1 and 30:1. As semiconductor device integration density increases, the aspect ration may be generally greater than 25:1. For example, the length a may be tens to hundreds of nm, and the height b may be hundreds to thousands of nm. When the aspect ratio is greater than 15:1, as explained above, the step coverage and layer quality of the dielectric layer 130 formed on the surfaces of the inner and outer cylinder type lower electrode 128 may be reduced. This is because when the dielectric layer 130 is formed using a conventional method of atomic layer deposition, a source gas for forming the dielectric layer 130 and an ozone gas which is an oxidizer, where the gasses are represented by arrows in FIG. 1A, may be depleted inside the cylinder type lower electrode 128 as denoted by a dashed circle corresponding to reference numeral "c" in FIG. 1A. The quality of the dielectric layer 130 may be reduced on lower surfaces of the cylinder type lower electrode 128.

According to conventional methods of forming a dielectric layer of a capacitor, for example a cylinder type capacitor, the amounts of supplied (injected) source gas and ozone gas may be increased, as denoted by arrows in FIG. 1B, which may improve the layer quality and step coverage of the dielectric layer 130 on lower surfaces of the cylinder type lower electrode. However, when the ozone gas is excessively supplied, the quality of the dielectric layer 130 on the lower surfaces of the cylinder type lower electrode 128 may improve, but the quality of the dielectric layer 130 on upper surfaces of the cylinder type lower electrode 128 may be reduced as denoted by a reference numeral "d" in FIG. 1B. Where the quality of the dielectric layer 130 is decreased, leakage current may increase.

Therefore, when the dielectric layer 130 is formed using a method of atomic layer deposition, the amount of the ozone gas, which is an oxidizer, should increase to improve the quality and step coverage of the dielectric layer 130 on lower surfaces of the cylinder type lower electrode 128 and should decrease to reduce deterioration of the upper part of the cylinder type lower electrode 128. The methods described below according to example embodiments may be applied in order to deposit a uniform, high quality dielectric layer with acceptable step coverage on high aspect ratio features, for example, the dielectric layer of a cylinder type capacitor. Example embodiments may be realized separately or in combination with each other.

Figure 2:
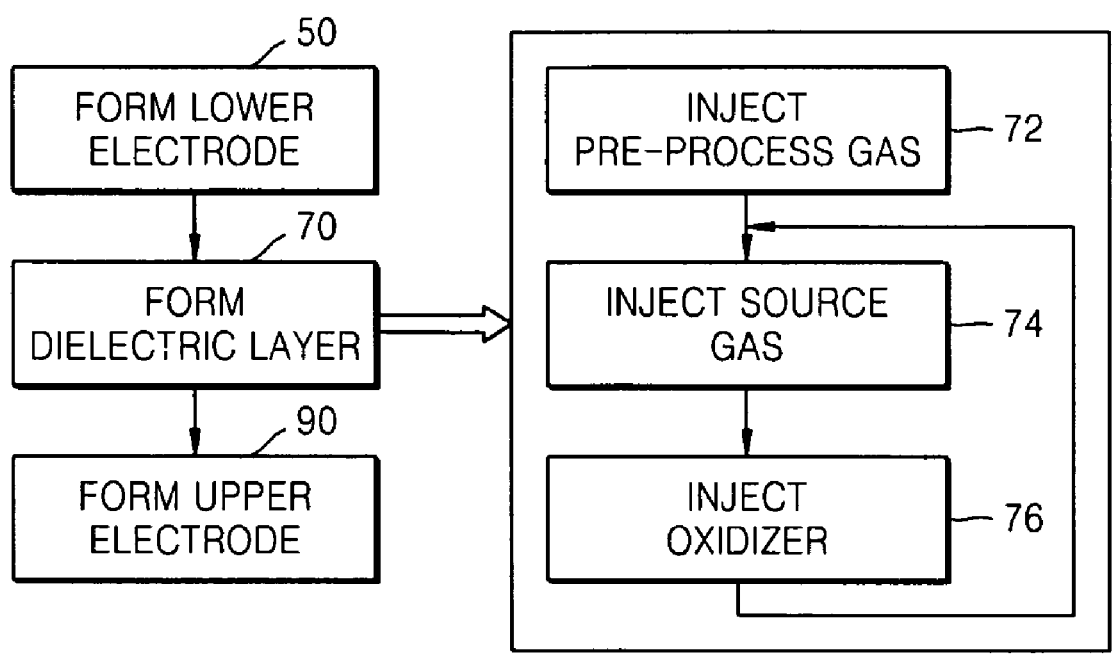
Figure 3:
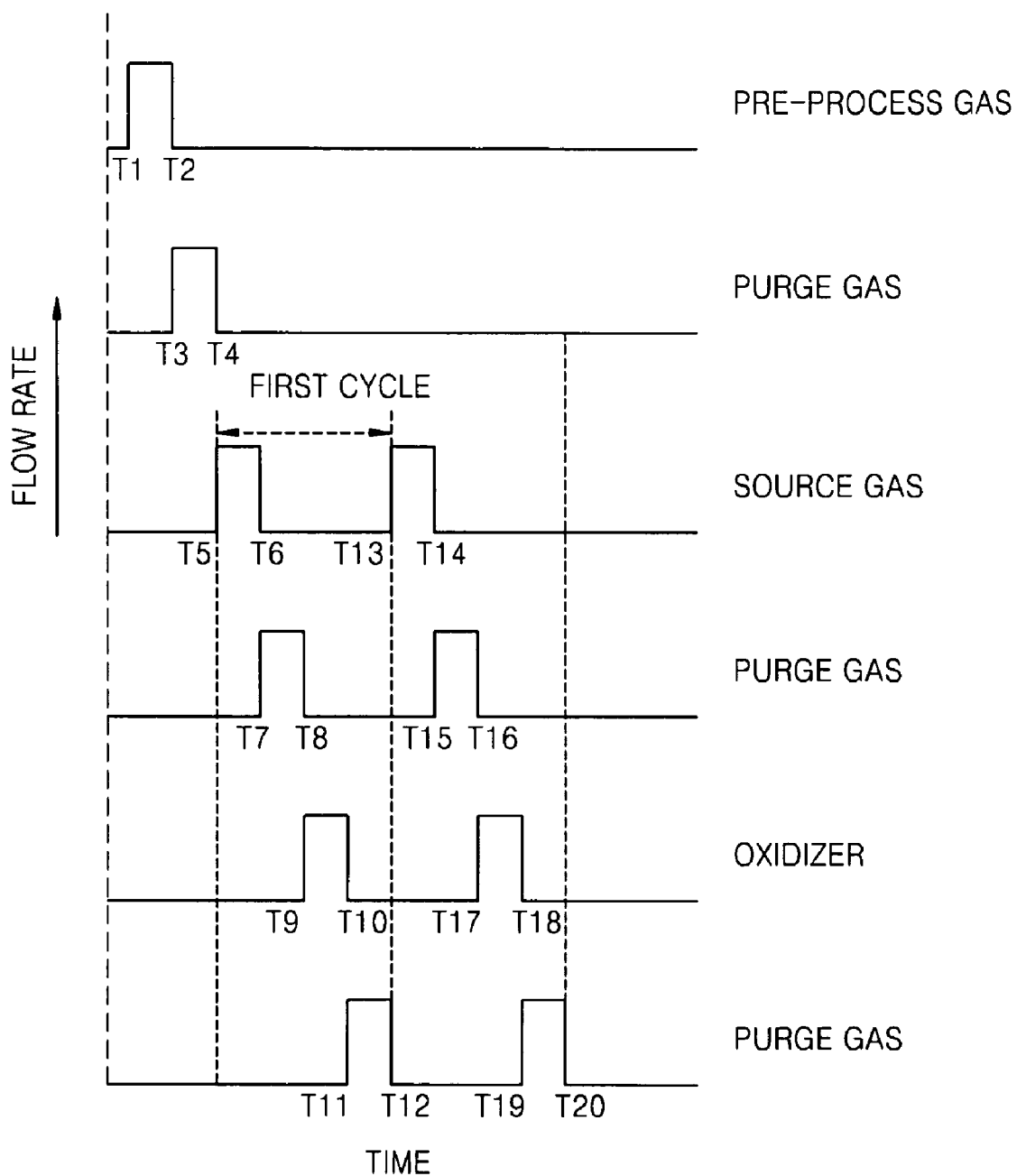

FIG. 2 is a flowchart of a method of fabricating a capacitor of a semiconductor device according to example embodiments. FIG. 3 is a diagram illustrating an injection order of gases injected into a chamber according to operation 70 of FIG. 2, in which a dielectric layer may be formed using a method of atomic layer deposition according to example embodiments. Referring to FIGS. 2 and 3, a lower electrode may be formed on a semiconductor substrate (e.g., a silicon substrate) in operation 50. The lower electrode may be, for example, a cylinder type, concave type, or pillar type lower electrode. According to example embodiments, the electrode may include a refractory metal (e.g., TiN, TaN, TiSiN, TiAlN, and/or WN). In operation 70, a dielectric layer may be formed on the lower electrode using a method of atomic layer deposition according to example embodiments. The dielectric layer may be a high k dielectric layer, such as a zirconium oxide layer. A capacitor may include an upper electrode on the dielectric layer as shown in operation 90.

Operation 70 will now be described in detail with reference to FIGS. 2 and 3. In FIG. 2, a purge process is omitted for convenience. The purge process may be performed by, for example, injecting a purge gas (e.g., nitrogen and/or argon) into an exhausted chamber. In operation 70, a pre-process operation, which may suppress deterioration of the lower electrode, may be performed on the lower electrode in operation 72. The dielectric layer may be formed on the lower electrode on which the pre-process operation is performed according to operations 74 and 76. The pre-process operation and the forming of the dielectric layer may be performed in one device (e.g., one ALD system) using a method of atomic layer deposition according to example embodiments. By using one device, contamination of the semiconductor substrate may be decreased and productivity of the manufacturing process may be increased (e.g., semiconductor device yield may be improved).

Referring to FIG. 3, operation 72 may include injecting a pre-process gas during time T1 to T2 into a chamber including a semiconductor substrate on which the lower electrode may be formed (e.g., an atomic layer deposition chamber) and purging a pre-process gas (e.g., ozone gas) during time T3 to T4. Injection of the pre-process gas may remove impurities on the surface of the lower electrode. For example, when the lower electrode is a TiN layer, one or more impurities (e.g., Cl and/or C) formed on the surface while forming the TiN layer may be removed by injecting the pre-process gas. Injection and purging of the pre-process gas may improve the quality of the dielectric layer because impurities may cause incomplete combination of the oxidizer (used to form the dielectric layer) with the lower electrode during operation 76, thereby preventing or reducing oxidization of the lower electrode.

Operations 74 and 76 may be performed by sequentially supplying a source gas and an oxidizer (e.g., ozone gas) to the chamber in which operation 72 is performed. For example, the source gas (e.g., a zirconium precursor) may be injected into the chamber during time T5 to T6 and then purged during time T7 to T8 (operation 74). The ozone gas may be injected into the chamber during time T9 to T10 and then purged during time T11 to T12 (operation 76). Operations 74 and 76 may form one cycle and the cycle may be performed one or more times. For example, the source gas may be again injected during time T13 to T14 and then purged during time T15 to T16 (operation 74). The ozone gas may be injected during time T17 to T18 and then purged during time T19 to T20 (operation 76). According to example embodiments including a zirconium precursor, the zirconium precursor may be, for example, TEMAZ (Tetrakis methylethylamino zirconium, $Zr[N(CH_3)(C_2H_5)]_4$), TDMAZ (Tetrakis dimethylamino zirconium), and/or TDMAZ (Tetrakis diethylamino zirconium). However, these are examples and other precursors may be used.

Figure 4:
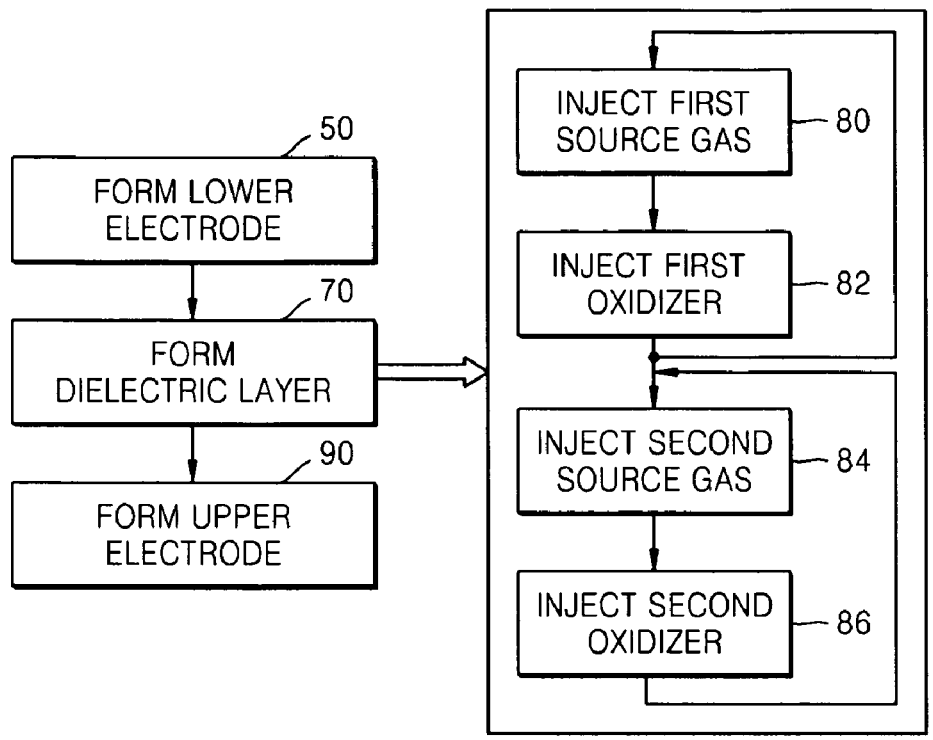
Figure 5:
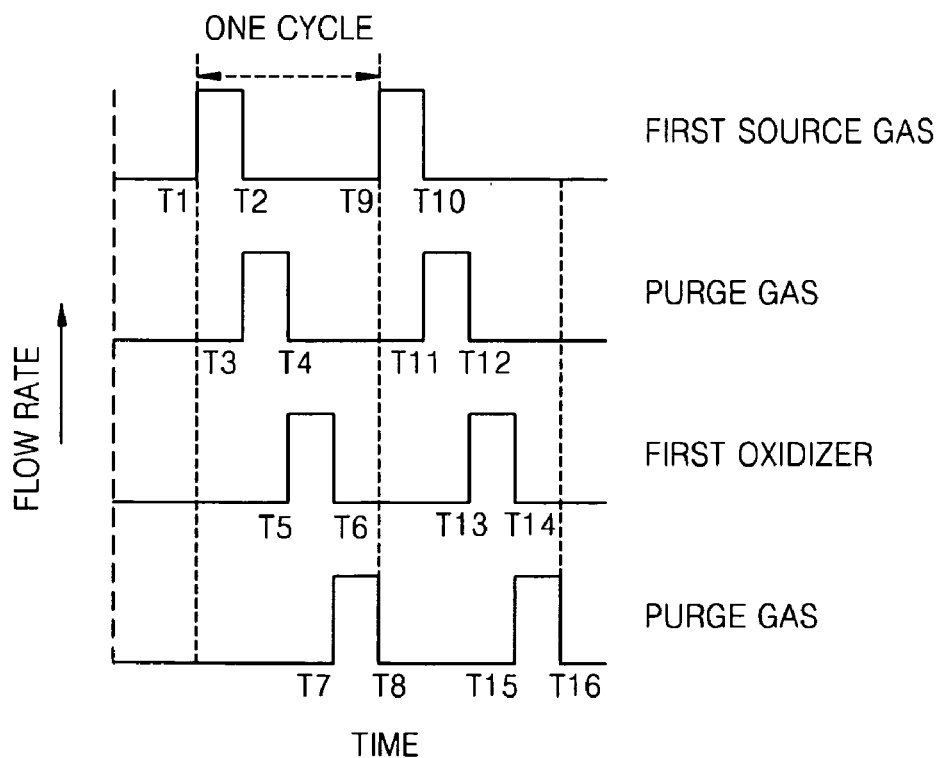
Figure 6:
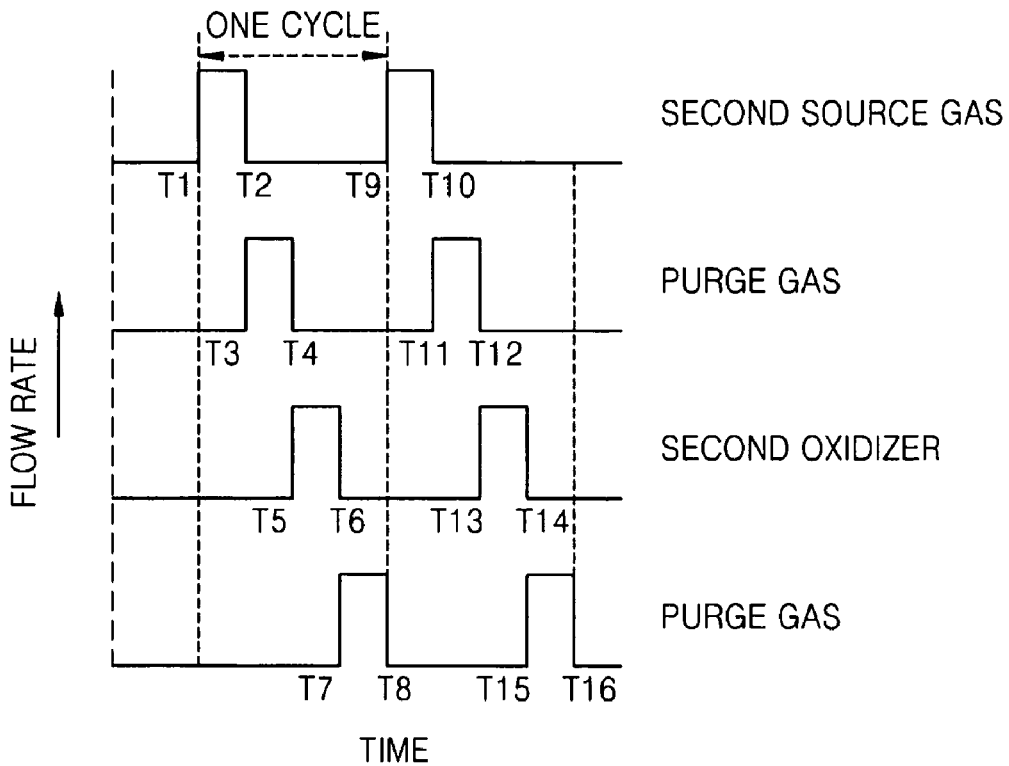

FIG. 4 is a flowchart of a method of fabricating a capacitor of a semiconductor device according to example embodiments. FIGS. 5 and 6 are diagrams illustrating injection orders of gases injected into a chamber according to operation 70 of FIG. 4, in which a dielectric layer may be formed using a method of atomic layer deposition according to example embodiments. The method according to example embodiments shown in FIG. 4 may be similar to the method according to example embodiments shown in FIG. 2 except for operation 70. Descriptions of operations 50 and 90 are therefore omitted. According to example embodiments, operation 72 of FIG. 2 may be added before forming the dielectric layer (operation 70) in FIG. 4.

Operation 70 will now be described with reference to FIGS. 4 through 6. In FIGS. 4 through 6, purge processes are omitted for convenience. The purge processes may be performed by injecting a purge gas (e.g. nitrogen and/or argon) into a chamber. Operation 70 may include operations 80 and 82, including a pre-process operation of sequentially injecting a first source gas and a first oxidizer for forming the dielectric layer into the chamber, the chamber including a semiconductor substrate on which a lower electrode may be formed. Operations 80 and 82 may be repeatedly performed. Operation 70 may include operations 84 and 86, in which a second source gas and a second oxidizer may be sequentially injected into the chamber in which operations 80 and 82 are performed. The first oxidizer may have a lower oxidizing potential than the second oxidizer and operations 84 and 86 may be repeatedly performed.

Operations 80, 82, 84, and 86 may be performed in one device (e.g., one ALD system) using a method of atomic layer deposition according to example embodiments. Accordingly, contamination of the semiconductor substrate may be reduced and productivity of the manufacturing process may be increased (e.g., semiconductor device yield may be improved). The first and second source gases may include a zirconium precursor (e.g., TEMAZ, TDMAZ, and/or TDEAZ). The first oxidizer may be, for example, an oxygen gas, steam, a nitric oxide gas, and/or an ozone gas, mixed with a hydrogen gas, steam, nitrogen gas, and/or an ammonia gas. The second oxidizer may be, for example, an ozone gas.

According to example embodiments, a first source gas and a first oxidizer may be supplied prior to operations 84 and 86. A protection layer, which is used in operations 84 and 86, may be formed on the surface of the lower electrode by injecting the first source gas and the first oxidizer. The protection layer may be, for example, a zirconium oxide layer. When the protection layer is formed, the layer quality of the dielectric layer may be improved since the lower electrode and the second oxidizer may not mix with each other in operations 84 and 86. Further, deterioration of the lower electrode may be prevented and/or reduced by reducing the reaction between the lower electrode (e.g., TiN layer) and the first oxidizer, the first oxidizer having a lower oxidizing potential than a second oxidizer. Additionally, if the first oxidizer is an ozone gas mixed with a hydrogen gas, steam, a nitrogen gas, and/or an ammonia gas, oxygen radicals formed by the ozone gas may be substituted with hydroxyl radicals, suppressing a reaction between the lower electrode and the first oxidizer, thereby preventing or reducing deterioration of the lower electrode. When the deterioration of the lower electrode is prevented or reduced, the layer quality of the dielectric layer may be improved.

According to example embodiments, operations 80, 82, 84 and 86 will now be described with reference to FIGS. 5-6. Referring to FIG. 5, in operation 80, the first source gas (e.g., a zirconium precursor) may be injected during time T1 to T2 into a chamber (e.g., an atomic layer deposition chamber) including a lower electrode on a semiconductor substrate. The first source gas may be purged during time T3 to T4. In operation 82, the first oxidizer may be injected into the chamber during time T5 to T6 and then purged during time T7 to T8. The first source gas may be injected into the chamber during time T9 to T10 and then purged for T11 to T12. The first oxidizer may be injected into the chamber during time T13 to T14 and then purged during time T15 to T16. Operations 80 and 82 may form one cycle and may be repeatedly performed.

Referring to FIG. 6, in operations 84, the second source gas (e.g., a zirconium precursor) may be injected into the chamber during time T1 to T2 and then purged during time T3 to T4. In operation 86 the second oxidizer may be injected to the chamber during time T5 to T6 and then purged during time T7 to T8. The second source gas may be injected into the chamber during time T9 to T10 and then purged during time T11 to T12. The second oxidizer may be injected into the chamber during time T13 to T14 and then purged during time T15 to T16. Operations 84 and 86 may form one cycle and may be repeatedly performed.

Figure 7:
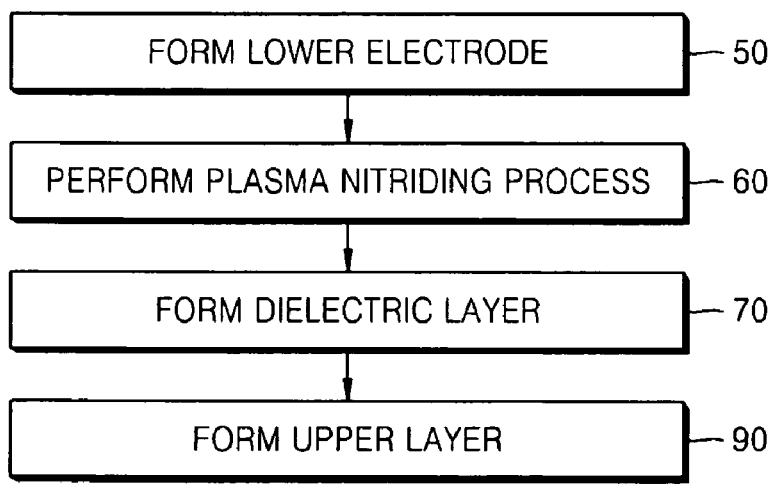

FIG. 7 is a flowchart of a method of fabricating a capacitor of a semiconductor device according to example embodiments. The method may be similar to the methods according to FIGS. 2 and 4, except that a plasma nitridization process may be performed on the lower electrode as a pre-process operation, for example, prior to operation 70. Operation 72 of FIG. 2 may be further included, for example, prior to the plasma nitridization process of FIG. 7. Operation 70 of FIG. 7 may be performed in the same manner as FIGS. 2 and/or 4.

In operation 50, a lower electrode may be formed on a semiconductor substrate (e.g., a silicon substrate). Operation 72 of FIG. 2 may be optionally performed. In operation 60, a plasma nitridization process may be performed on the surface of the lower electrode by using, for example, a remote plasma device. The plasma nitridization process may be performed using the same device as the device forming the dielectric layer (e.g., an ALD system). The plasma nitridization process may be performed by using a remote plasma device connected to the dielectric layer forming device. Remote plasma differs from direct plasma in that the substrate is placed outside the plasma generation region. For example, instead of forming plasma by applying a high voltage between two electrodes and placing the semiconductor substrate on one of the electrodes, a remote plasma is created away from the substrate surface. The remote plasma device enables plasma radicals to uniformly reach the entire surface of a semiconductor substrate that is curved by diffusion according to the concentration scale of the plasma radicals. The remote plasma device may use, for example, a nitrogen gas or an ammonia gas.

When the plasma nitridization process is performed on a lower electrode of a capacitor a protection layer (e.g., nitride layer) may be formed on the surface of the lower electrode (e.g., a TiN layer). The lower electrode may be protected by the protection layer during the formation of the dielectric layer because the protection layer may prevent or reduce a reaction between the oxidizer (e.g., ozone gas) and the lower electrode. By protecting the lower electrode, the layer quality of the dielectric layer may be improved. In operation 70, the dielectric layer may be formed on the nitrided lower electrode by using a method of atomic layer deposition according to example embodiments. Operation 70 may performed, for example, via operations 74 and 76 of FIG. 2 or operations 84 and 86 of FIG. 4. An upper electrode may be formed on the dielectric layer in operation 90.

Figure 8:
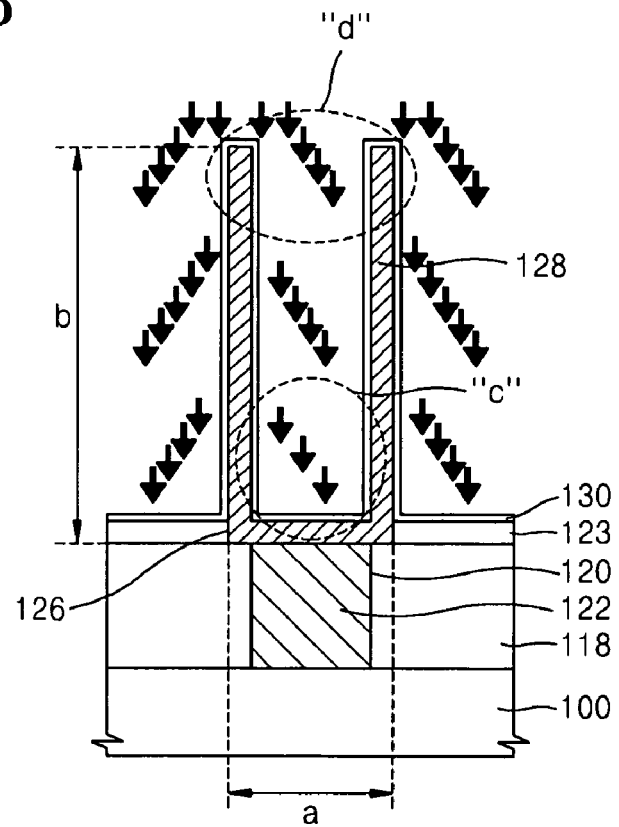

FIG. 8 is a cross-sectional view illustrating a capacitor of a semiconductor device formed according to example embodiments. FIG. 8 may be compared with FIGS. 1A and 1B. Like reference numerals denote like elements in FIGS. 8, 1A, and 1B. Referring to reference numerals "c" and "d" in FIG. 8, it may be seen that the dielectric layer 130 is uniformly formed in the top and bottom of the cylinder type lower electrode 128. This may be because impurities were removed from the surface of the cylinder type lower electrode 128 and/or or a protection layer (not shown) was formed on the cylinder type lower electrode 128 prior to forming the dielectric layer 130 by using a method of atomic layer deposition according to example embodiments. Accordingly, the cylinder type lower electrode 128 may not be deteriorated. Additionally, as denoted by the reference numeral "d" in FIG. 8, the top of the cylinder type lower electrode 128 may not be damaged (as in FIG. 1A) while forming the dielectric layer 130.

Figure 9:
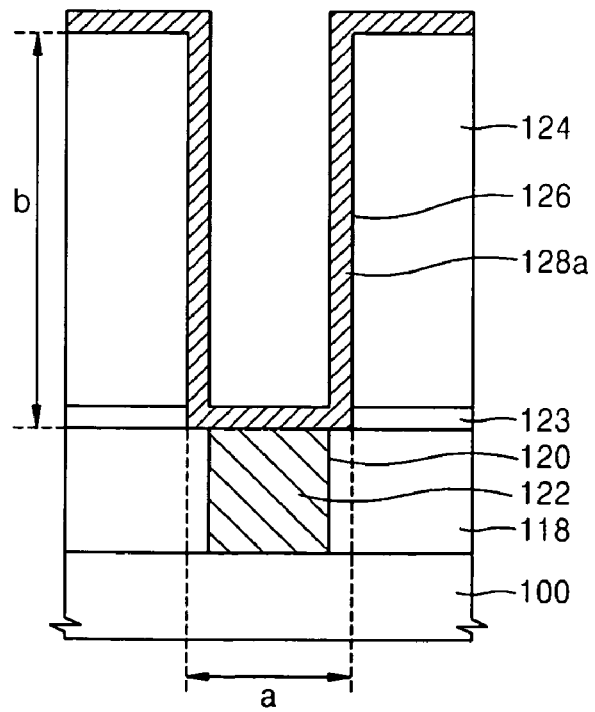
Figure 10:
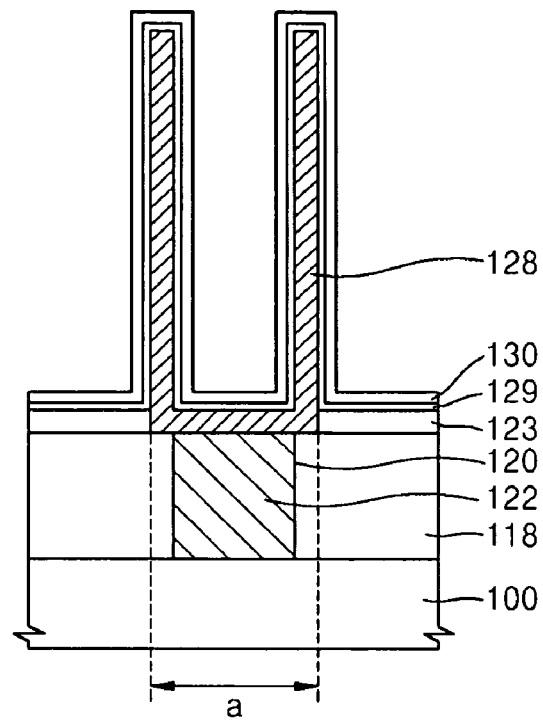
Figure 11:
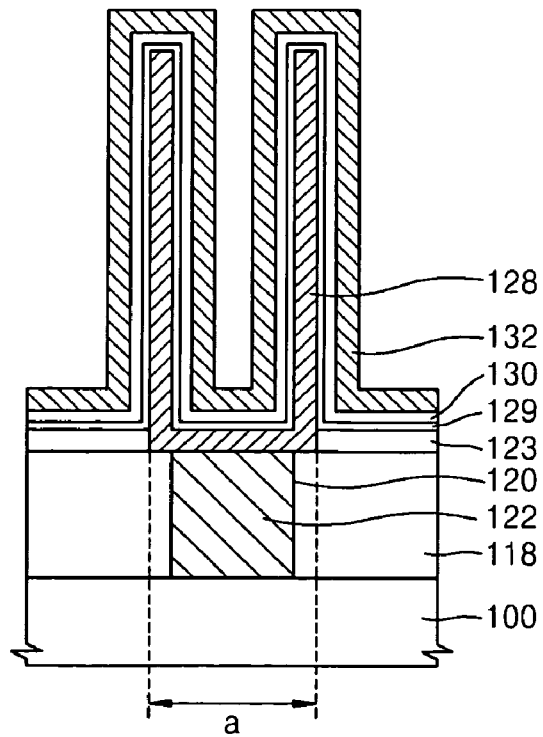

FIGS. 9-11 are cross-sectional views illustrating a method of fabricating a capacitor of a semiconductor device according to example embodiments. Referring to FIG. 9, a first interlayer insulation layer 118 (e.g., a silicon oxide layer) may be formed on a semiconductor substrate 100 (e.g., a silicon substrate). Other elements, for example a transistor, may also exist on the semiconductor substrate 100, but are not illustrated for convenience. A first contact hole 120 may be formed in the first interlayer insulation layer 118 and a contact plug 122 may be formed in the first contact hole 120. An etch blocking layer 123 (e.g., a silicon nitride layer) and a second interlayer insulation layer 124 (e.g., a silicon dioxide layer) may be formed on the contact plug 122 and the first interlayer insulation layer 118.

A second contact hole 126 exposing the contact plug 122 may be formed by patterning the second interlayer insulation layer 124 and the etch blocking layer 123. An aspect ratio (b/a) of the second contact hole 126 increases with semiconductor device integration density. According to example embodiments, the aspect ratio may be 20:1 to 30:1 (e.g., above 25:1). A metal layer 128a may be formed on the surface of the second interlayer insulation layer 124 and may be patterned on the bottom surface and side of the second contact hole 126 to form a lower electrode 128 (shown in FIG. 10). The metal layer 128a may be formed by, for example, using chemical vapor deposition (CVD) or a method of atomic layer deposition. The metal layer 128a may be formed of, for example, metal (e.g., Al and/or Cu) and/or may be a metal layer including a refractory metal (e.g., a TiN layer, a TaN layer, a TiSiN layer, a TiAlN layer, or a WN layer).

Referring to FIGS. 9 and 10, a sacrificial layer (not shown) may be formed on the surface of the semiconductor substrate 100 on which the metal layer 128a is formed, embedding the second contact hole 126. The sacrificial layer may be patterned and/or etched until the surface of the second interlayer insulation layer 124 is exposed. The sacrificial layer and the second interlayer insulation layer 124 may be removed to expose the cylinder type lower electrode 128 where the metal layer 128a remains on the bottom surface and side of the second contact hole 126. A dielectric layer 130 may be formed according to example embodiments described with respect to FIGS. 2, 4 and/or 7. The dielectric layer 130 may be formed on the surface of the cylinder type lower electrode 128. A protection layer 129 may be formed below the dielectric layer 130, as described with respect to FIGS. 4 and/or 7. Alternatively, the protection layer 129 may be included in the dielectric layer 130.

Referring to FIG. 11, an upper layer 132 may be formed on the semiconductor substrate 100 on which the dielectric layer 130 is formed. The upper layer 132 may be formed of the same or a different metal from the cylinder type lower electrode 128. The upper layer may be formed of, for example, a metal (e.g., Al and/or Cu), a refractory metal, or a precious metal. The upper layer 132 may be formed by using CVD or a method of atomic layer deposition. Accordingly, a capacitor, in which the cylinder type lower electrode 128, the dielectric layer 130, and the upper layer 132 are stacked on the semiconductor substrate 100 may be formed.

FIGS. 12-16 are diagrams for describing a method of forming a dielectric layer using a method of atomic layer deposition according to example embodiments. In FIGS. 12-16, the protection layer 129 may be formed on the cylinder type lower electrode 128 according to example embodiments (e.g., as described with reference to FIGS. 4 and/or 7). The protection layer 129 may be included in the dielectric layer 130 according to example embodiments. Referring to FIGS. 12-16, a method of forming a dielectric layer after the pre-process operation is performed will now be described.

Figure 12:
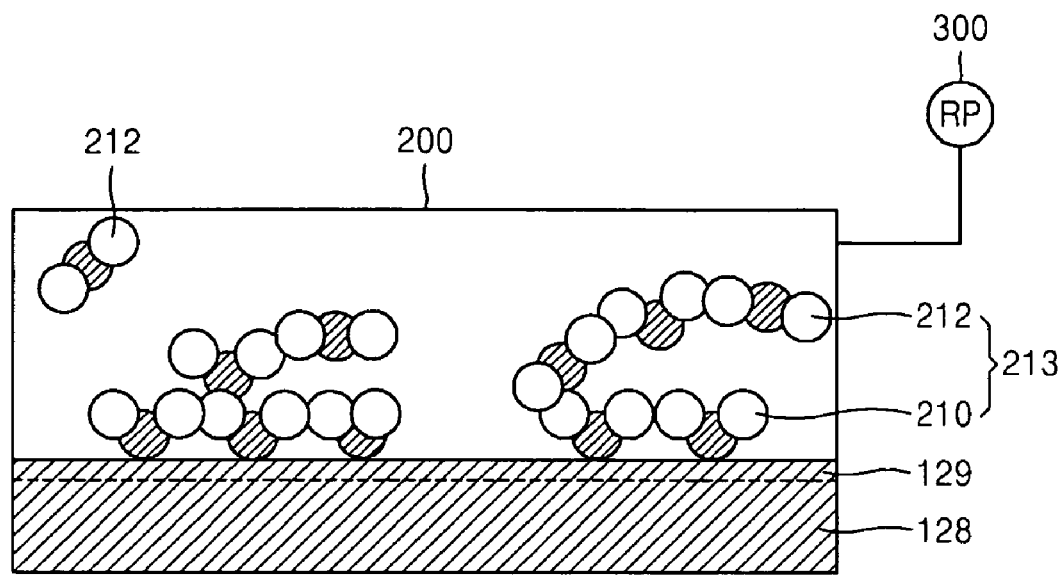

Referring to FIG. 12, a semiconductor substrate including the cylinder type lower electrode 128 may be inside a chamber 200. The protection layer 129 may be formed on the surface of the cylinder type lower electrode 128 using, for example, the pre-process operation described with respect to FIG. 4 (operations 80 and 82) and/or the nitridization process described with respect to FIG. 7. A remote plasma device 300 for nitriding may be connected to the chamber 200 and the protection layer 129 may be formed on the cylinder type lower electrode 128 by performing a pre-process operation on the surface of the cylinder type lower electrode 128 using the remote plasma device 300.

Source gas 213, which may include a first portion 210 and a second portion 212, is injected into the chamber 200 after the pre-process operation. While injecting the source gas 213, the temperature inside the chamber 200 may be maintained between about 150 to 400° C. The pressure inside the chamber 200 may be maintained between about 0.1 and 3 Torr. The source gas 213 may be injected into the chamber 200 for about 0.1 to 5 seconds (e.g., about 3 seconds). By injecting the source gas 213 into the chamber 200, the first portion 210 of the source gas 213 may be chemically adsorbed to the cylinder type lower electrode 128 and/or the protection layer 129 and the second portion 212 may be physically adsorbed to the first portion 210 or roam inside the chamber 200. Although the parameters of temperature, pressure and time are particularly described using examples, example embodiments are not so limited and other combinations may be used.

Figure 13:
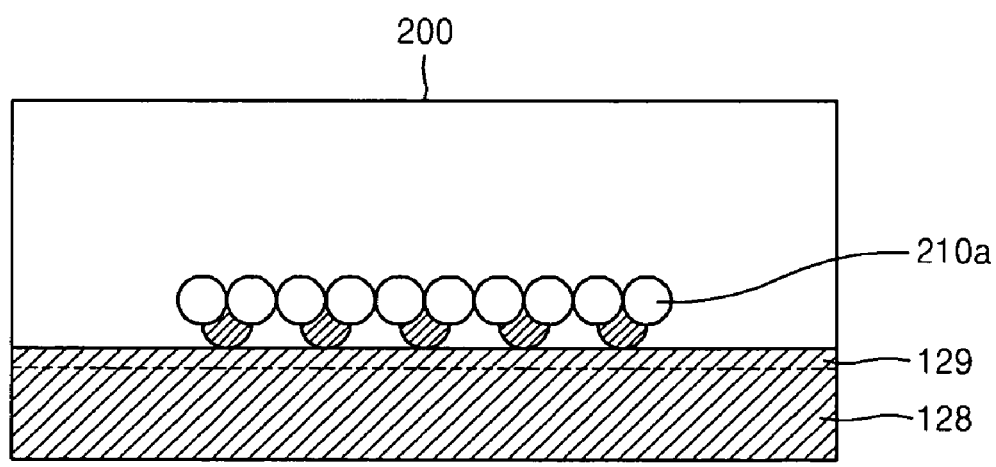

Referring to FIGS. 12 and 13, a purge gas (e.g., nitrogen or argon) may be injected into the chamber 200. The purge gas may be injected for about 0.5 to 20 seconds. By injecting the purge gas into the chamber 200, the second portion 212 of the source gas 213 roaming the chamber 200 or that is physically adsorbed, may be removed. Precursor molecules 210a may be left from the chemically adsorbed first portion 210 of the source gas 213 on the cylinder type lower electrode 128 and/or the protection layer 129.

Figure 14:
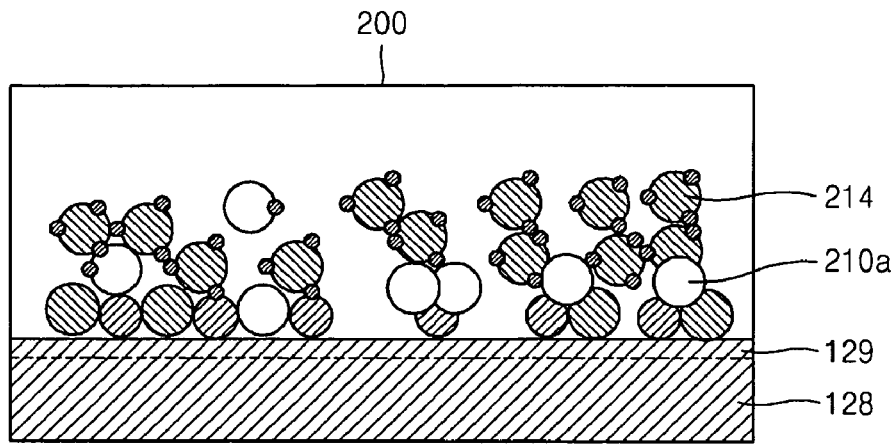
Figure 15:
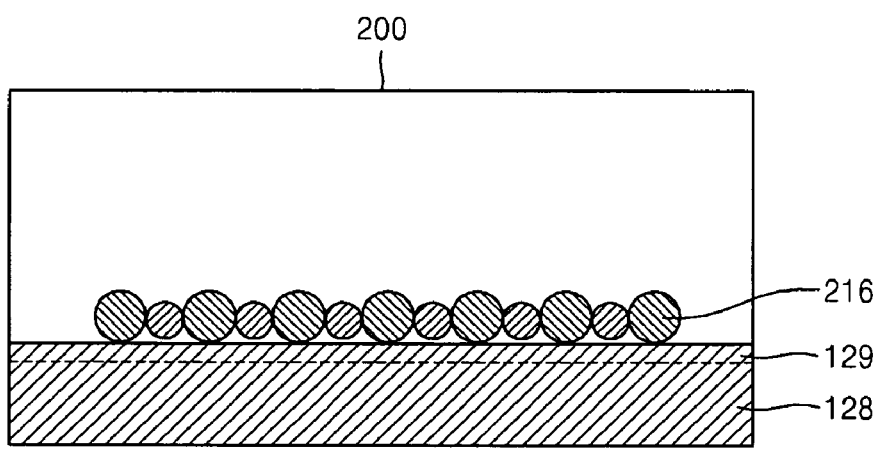

Referring to FIG. 14, an oxidizer 214 (e.g., ozone gas) may be injected into the chamber 200. The oxidizer 214 may be injected into the chamber 200 for about 1 to 15 seconds (e.g., about 5 seconds). The precursor molecules 210a and the oxidizer 214 may chemically react with each other on the cylinder type lower electrode 128 and/or the protection layer 129, thereby oxidizing the precursor molecules 210a. Referring to FIG. 15, a purge gas (e.g., nitrogen and/or argon) may be injected into the chamber 200. The purge gas may be injected for about 0.5 to 20 seconds and may remove the oxidizer 214 that does not chemically react. Accordingly, a thin solid layer 216 including a high k dielectric oxide layer may be formed on the cylinder type lower electrode 128 and/or the protection layer 129.

Figure 16:
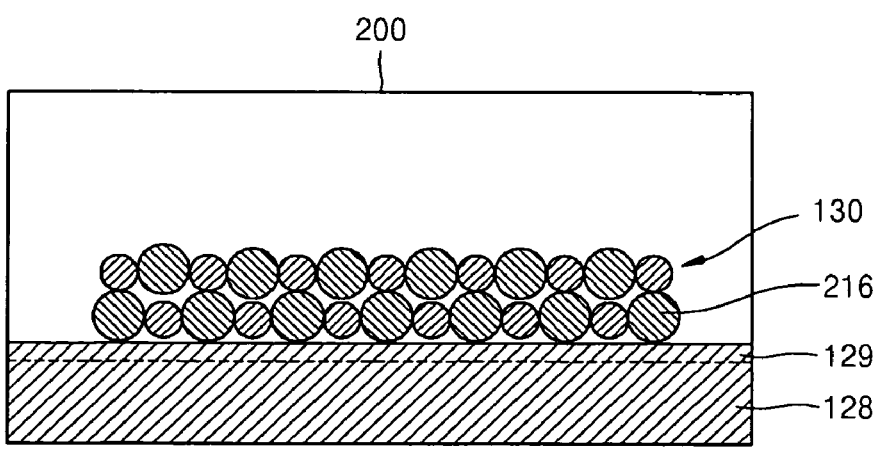

Referring to FIG. 16, processes described with respect to FIGS. 12-15 may be repeated at least once. As a result, the dielectric layer 130 including one or more thin solid layers 216 including a high k dielectric oxide layer may be formed on the cylinder type lower electrode 128, together with the protection layer 129.

Figure 17:
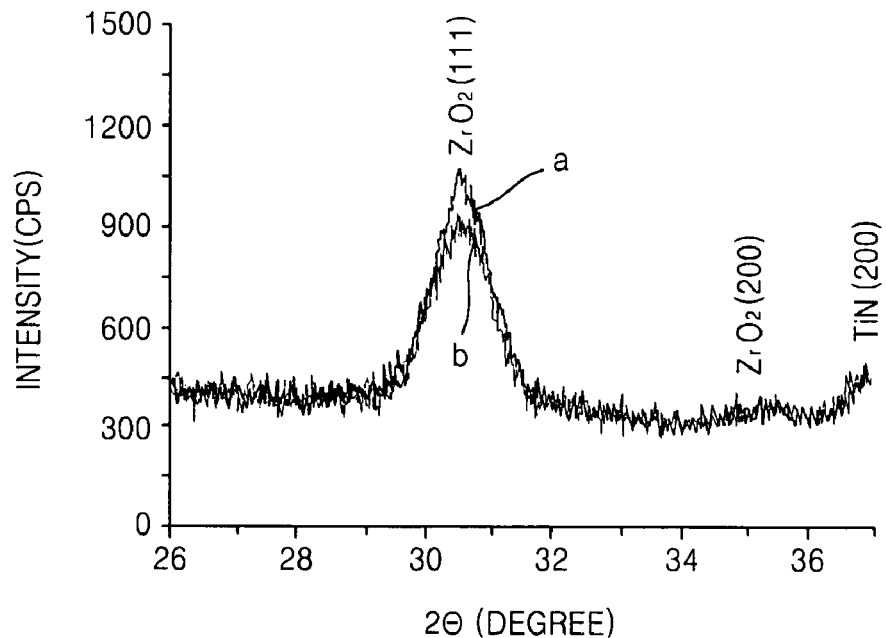

Capacitor characteristics of a semiconductor device according to example embodiments will now be described. FIG. 17 is a comparative graph which may show improved crystallinity of dielectric layers according to example embodiments. FIG. 17 is an x-ray graph of a dielectric layer formed: according to example embodiments including a pre-process operation (e.g., ozone gas is injected as a pre-process gas) (denoted by a); and when the pre-process operation is not performed (denoted by b). FIG. 17 demonstrates improvement of crystallinity of dielectric layers according to example embodiments. In FIG. 17, the y-axis denotes a count per second (CPS). The x-ray graph of FIG. 17 is of a capacitor including a TiN layer as a lower electrode and a zirconium oxide layer as a dielectric layer. Referring to FIG. 17, when the ozone gas is injected in the pre-process operation before forming a dielectric layer, an x-ray intensity of the zirconium oxide layer may be increased and may demonstrate improved crystallinity.

Figure 18:
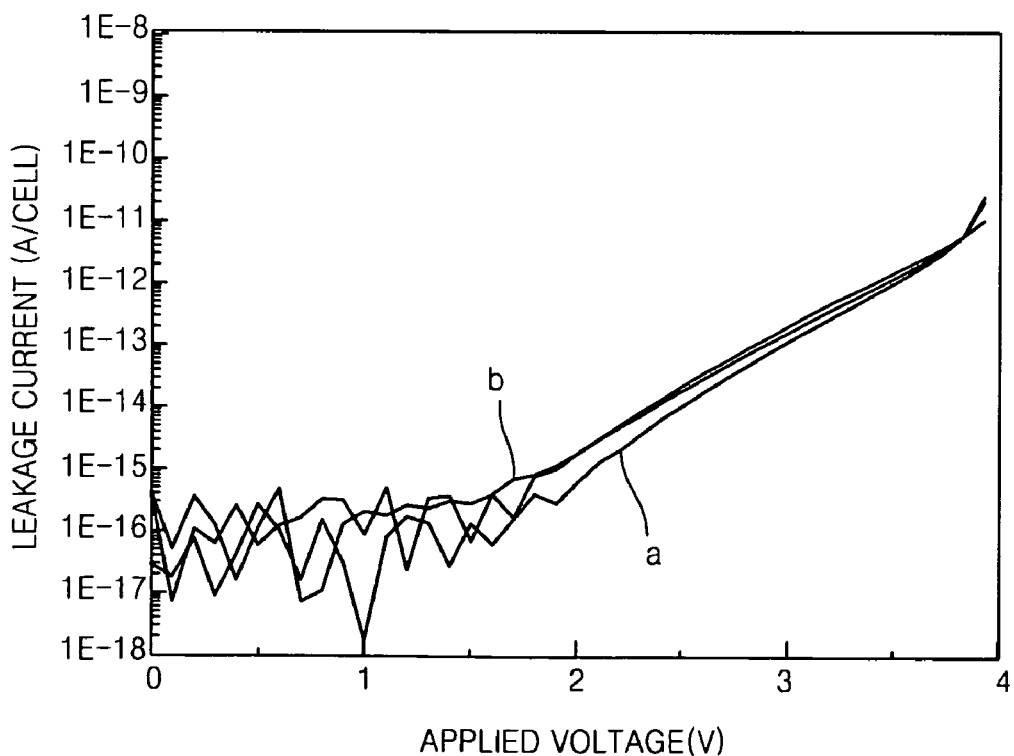
Figure 19:
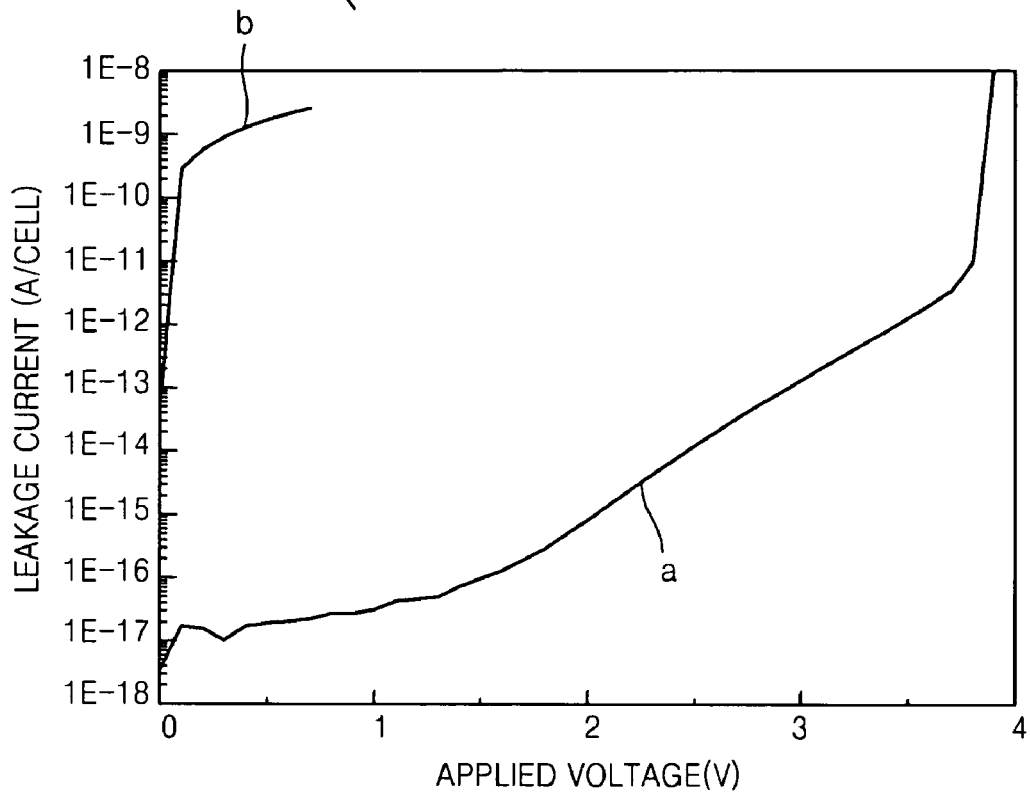

FIG. 18 is a graph showing leakage current as a function of voltage for capacitors of semiconductor devices according to example embodiments. FIG. 19 is a graph showing leakage current as a function of voltage for capacitors of semiconductor devices according to the conventional art, to be compared with FIG. 18. In FIG. 18, leakage current values are measured by applying a voltage to a capacitor a plurality of times where a pre-process operation has been performed prior to forming a dielectric layer (e.g., when the ozone gas was injected as a pre-process gas). In FIG. 19, leakage current values are measured by applying a voltage to a capacitor a plurality of times where the pre-process operation has not been performed prior to forming a dielectric layer, presented as a comparative example. In FIGS. 18 and 19, a TiN layer is used as a lower electrode and a zirconium oxide layer is used as a dielectric layer.

Referring to FIG. 18, leakage current per cell may not remarkably increase in cases where: a voltage is applied to the capacitor for the first time (denoted by a); and when a voltage is applied to the capacitor 20 times (denoted by b). For example, when the applied voltage is about 2 volts (V), the capacitor has a leakage current of about 1E-15 ampere (A). Referring to FIG. 19, voltage applied to a capacitor after the first time (the first time denoted by a) shows an increased leakage current (denoted by b) which may correspond to dielectric breakdown phenomenon. Comparing FIGS. 18 and 19, it can be seen that the leakage current characteristics of the capacitors according to example embodiments may be improved.

Figure 20:
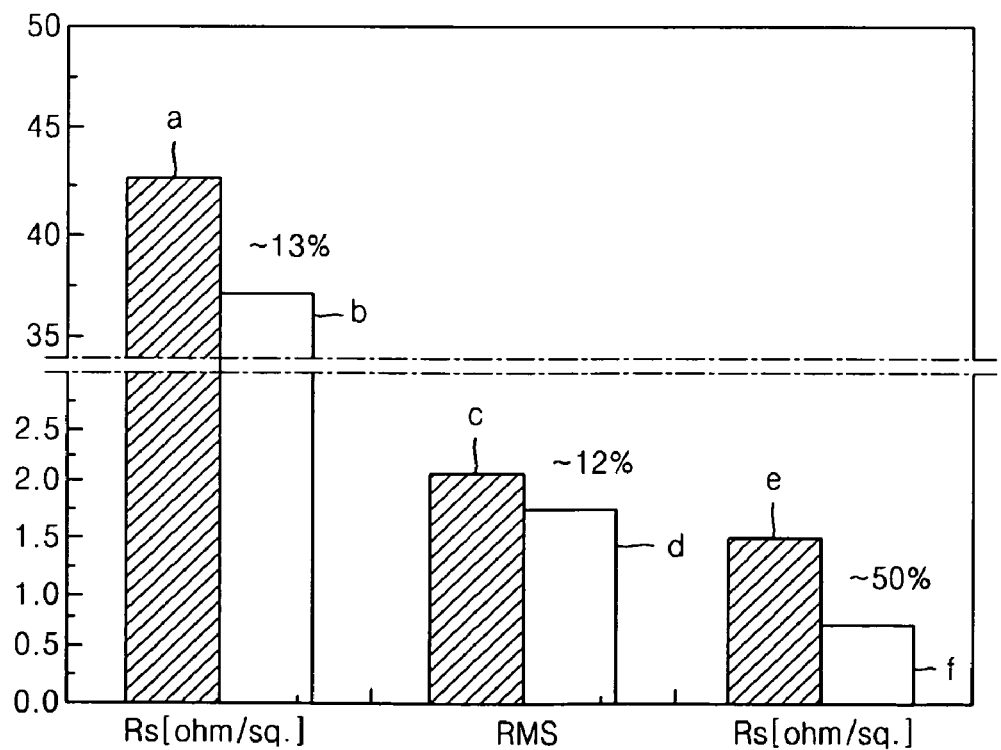

FIG. 20 is a comparative graph showing characteristics of a lower electrode of a capacitor of a semiconductor device fabricated using a method according to example embodiments and a lower electrode of a capacitor of a semiconductor device fabricated according to the conventional art. Labels b, d and f of FIG. 20 correspond to characteristics of a TiN lower electrode in a case where a plasma nitridization process has been performed on the lower electrode before forming the dielectric layer as described, for example, with respect to FIG. 7. Labels a, c and e correspond to characteristics of a TiN lower electrode fabricated according to the conventional art where the lower electrode is not nitrided. Comparing cases (b, d, and f) where the plasma nitriding process is performed and cases (a, c, and e) where the plasma nitriding process is not performed, surface resistance (Rs) of the lower electrode indicated as a unit surface per resistance (Ohm/square) may be decreased by about 13%, surface roughness (RMS) of the lower electrode indicated as root mean square may be decreased by about 12% and chlorine density of the lower electrode indicated as atomic % may be decreased by about 50%. When a plasma nitridization process is performed according to example embodiments it can be seen that physical and chemical characteristics of the lower electrode may be improved.

Figure 21:
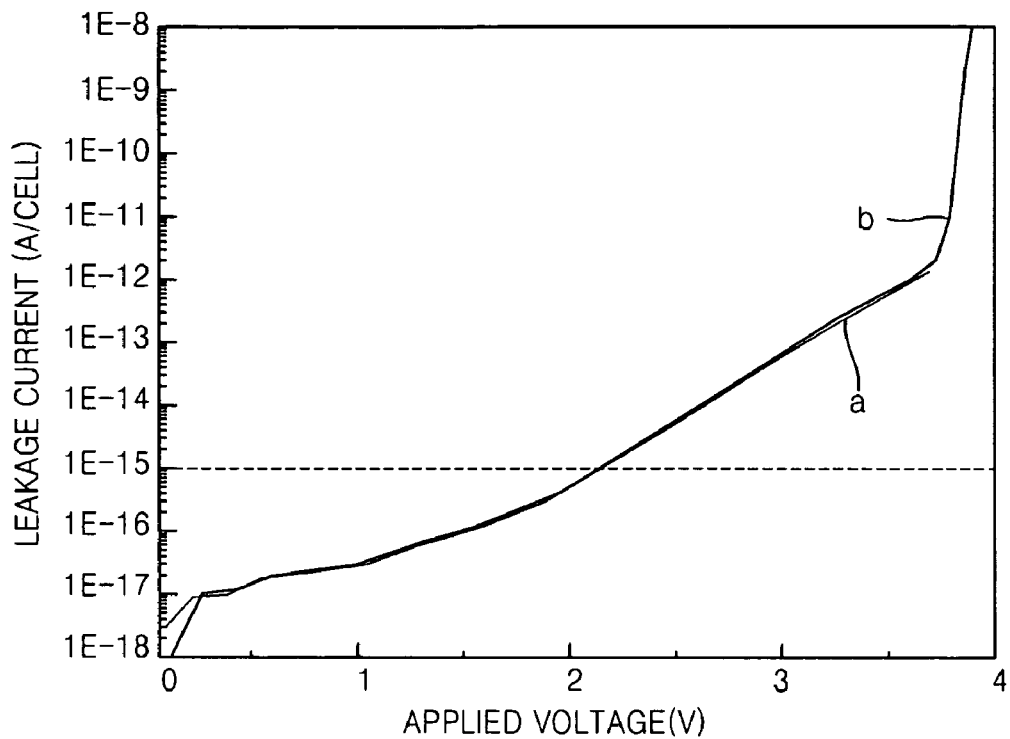
Figure 22:
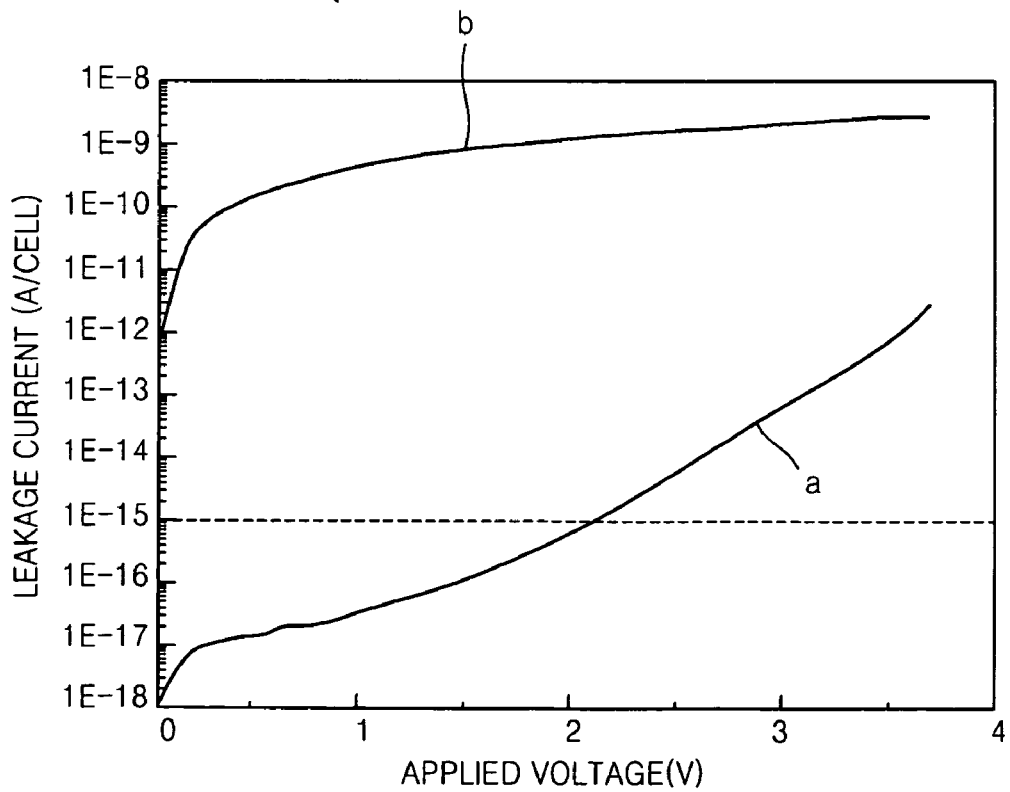

FIG. 21 is a graph showing leakage current as a function of applied voltage for capacitors of semiconductor devices according to example embodiments. FIG. 22 is a graph showing leakage current as a function of applied voltage for capacitors of semiconductor devices according to the conventional art, to be compared with the graph of FIG. 21.

In FIG. 21, leakage current values are measured while applying a voltage to a capacitor a plurality of times where a plasma nitridization process has been performed on the lower electrode prior to forming the dielectric layer, for example, as described with respect to FIG. 7. In FIG. 22, leakage current values are measured while applying a voltage to a capacitor a plurality of times where the plasma nitridization process has not been performed on the lower electrode prior to forming the dielectric layer. In FIGS. 21 and 22, a TiN layer is used as a lower electrode and a zirconium oxide layer is used as a dielectric layer.

Referring to FIG. 21, leakage current per cell may not remarkably increase in cases where: a voltage is applied to the capacitor for the first time (denoted by a); and when the voltage is applied to the capacitor for about 38 times (denoted by b). For example, the applied voltage of about 2V corresponds to a reference leakage current value of about 1E-15A in either case. Referring to FIG. 22, when a voltage is applied to a capacitor after the first time the voltage is applied to the capacitor (denoted by a), the applied voltage of about 2 V corresponds to a reference leakage value of about 1E-15A, but when the voltage is applied to the capacitor for about 11 times (denoted by b), the leakage current value increases and may correspond to dielectric breakdown phenomenon. Accordingly, it can be seen that the leakage current characteristics of the capacitors according to example embodiments may be improved.

While example embodiments have been particularly shown and described, it will be understood by one of ordinary skill in the art that variations in form and detail may be made therein without departing from the spirit and scope of the claims.

What is claimed is:

1. A method of fabricating a capacitor of a semiconductor device, the method comprising:
forming a lower electrode on a semiconductor substrate;
performing a pre-process operation on the lower electrode, the pre-process operation including exposing the lower electrode to an ozone gas, and sequentially injecting a source gas and a pre-process oxidizer, in an atomic layer deposition device;
forming a dielectric layer on the lower electrode using the source gas and an ozone oxidizing gas in the atomic layer deposition device after the performing of the pre-process operation, an oxidizing potential of the ozone oxidizing gas greater than an oxidizing potential of the pre-process oxidizer; and
forming an upper electrode on the dielectric layer.

2. The method of claim 1, wherein the pre-process operation includes a plasma nitridization process.

3. The method of claim 1, wherein the pre-process oxidizer includes at least one of an oxygen gas, steam, and a nitric oxide gas, and
the pre-process oxidizer is a mixed gas by mixing an ozone gas with at least one of a hydrogen gas, steam, a nitrogen gas, and an ammonia gas.

4. The method of claim 1, wherein sequential injection of the source gas and the pre-process oxidizer is performed a plurality of times.

5. The method of claim 1, wherein the source gas includes a metal precursor, and
the dielectric layer includes at least one of a lanthanide metal oxide layer, a hafnium oxide layer, an aluminum oxide layer, a zirconium oxide layer, a tantalum oxide layer, a titanium oxide layer, and a perovskite oxide layer.

6. The method of claim 1, wherein the lower electrode is one of a cylinder type, a concave type, and a pillar type lower electrode.

7. The method of claim 1, wherein the lower electrode includes one of poly-silicon doped with an impurity, carbon (C), metal, and a refractory metal.

8. A method of fabricating a capacitor of a semiconductor device, the method comprising:
forming a lower electrode on a semiconductor substrate;
forming a dielectric layer on the lower electrode by atomic layer deposition in one device, the atomic layer deposition including a first sequential injection of a first source gas and a first oxidizer into a chamber followed by a second sequential injection of a second source gas and a second oxidizer into the chamber, the first oxidizer having a lower oxidizing potential than the second oxidizer; and
forming an upper electrode on the dielectric layer.

9. The method of claim 8, further comprising:
injecting an ozone gas into the chamber before the forming of the dielectric layer.

10. The method of claim 8, further comprising:
performing a plasma nitridization process on a surface of the lower electrode before the forming of the dielectric layer.

11. The method of claim 8, wherein the first oxidizer includes one of an oxygen gas, steam, and a nitric oxide gas, and the first oxidizer is mixed gas by mixing an ozone gas with one of a hydrogen gas, steam, a nitrogen gas, and an ammonia gas.

12. The method of claim 8, wherein the forming of the dielectric layer includes a first cycle including the first sequential injection and a second cycle including the second sequential injection, the first cycle is performed a plurality of times, and the second cycle is performed a plurality of times.

13. The method of claim 8, wherein the first and second source gases include metal precursors, and the dielectric layer includes one of a lanthanide metal oxide layer, a hafnium oxide layer, an aluminum oxide layer, a zirconium oxide layer, a tantalum oxide layer, a titanium oxide layer, and a perovskite oxide layer.

14. The method of claim 8, wherein the lower electrode is one of a cylinder type, a concave type, and a pillar type lower electrode.

15. A method of fabricating a capacitor of a semiconductor device, the method comprising:

forming a lower electrode on a semiconductor substrate;

forming a dielectric layer including a high k dielectric oxide layer on the lower electrode by atomic layer deposition in one device, the atomic layer deposition including a first sequential injection of a first source gas including a metal precursor and a first oxidizer into a chamber, and then a second sequential injection of a second source gas including the metal precursor and a second oxidizer into the chamber, the first oxidizer having a lower oxidizing potential than the second oxidizer; and forming an upper electrode on the dielectric layer.

16. The method of claim 15, further comprising:

injecting an ozone gas into the chamber before the forming of the dielectric layer.

17. The method of claim 15, wherein the metal precursor includes one of an alkyl, amine, β-diketone, cyclopentadienyl (Cp), and chlorine (Cl) based ligand, the first oxidizer includes one of an oxygen gas, steam, a nitric oxide gas and an ozone gas, the first oxidizer is a mixed gas by mixing an ozone gas with at least one of a hydrogen gas, steam, a nitrogen gas, and an ammonia gas, and the second oxidizer includes an ozone gas.

18. The method of claim 15, wherein the forming of the dielectric layer includes a first cycle including the first sequential injection and a second cycle including the second sequential injection, the first cycle is performed a plurality of times, and the second cycle performed a plurality of times.

19. The method of claim 1, wherein the lower electrode includes one of carbon (C), metal and a refractory metal.

* * * * *